FORWARD AGC CIRCUIT
Filed April 11, 1966
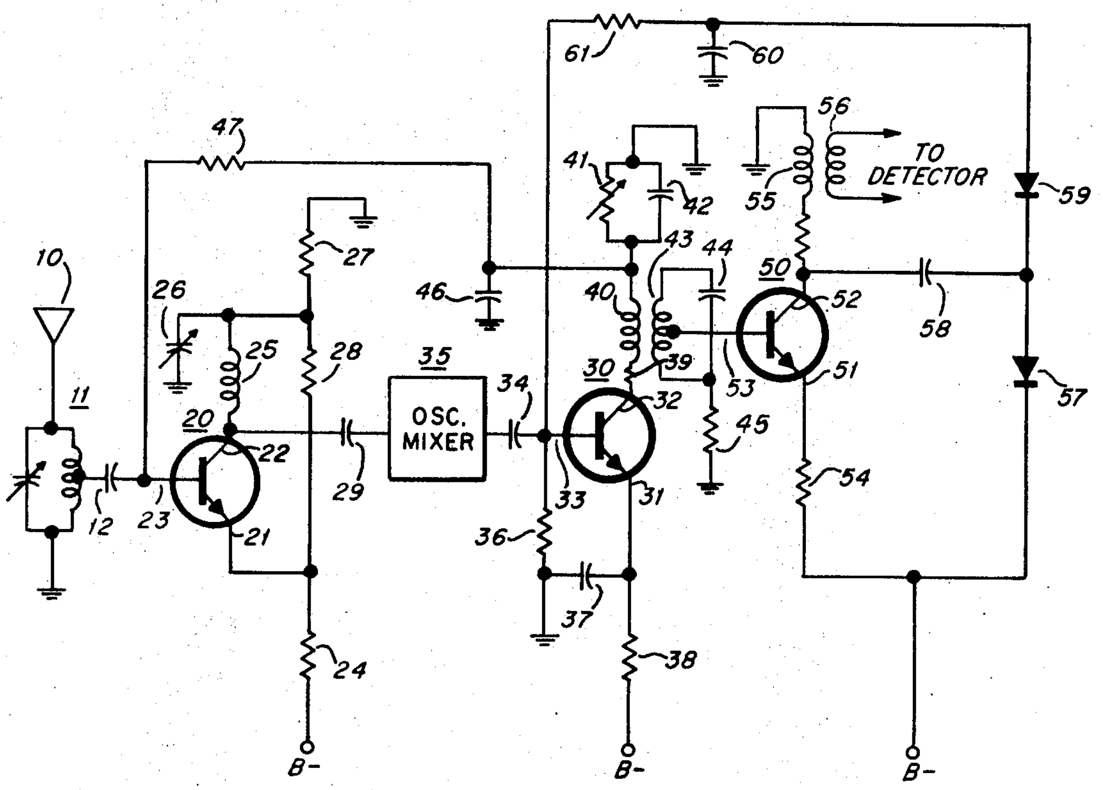
INVENTORS.
Mohammed A. Rakha
Si Kun Chang
By Nicholas A. Camasto
Atty.

3,559,073

FORWARD AGC CIRCUIT

Si Kun Chang and Mohammed A. Rakha, Chicago, Ill., assignors to Admiral Corporation, Chicago, Ill., a corporation of Delaware Filed Apr. 11, 1966, Ser. No. 541,792
Int. Cl. H04b 1/16
U.S. Cl. 325—405 2 Claims

ABSTRACT OF THE DISCLOSURE

A transistorized FM receiver having conventional AGC control means for adjusting the gain of the IF amplifier. The IF amplifier acts as a DC amplifier also and includes a DC responsive circuit for supplying bias to the RF amplifier, which is operated at the maximum point on its gain versus bias characteristic curve. The RF amplifier is forward biased in the presence of increasing signal level and driven toward saturation.

This invention relates to signal receiving apparatus and particularly to signal receiving apparatus having a gain controlled radio frequency amplifying stage.

Automatic gain control systems (also commonly referred to as automatic volume control with respect to radio apparatus) have been extant for many years. Proper AGC is not only technically desirable, but is a consumer accepted feature which must be present in any commercial piece of apparatus. Formerly, it was acceptable to gain control of a limited number of stages, and in superheterodyne type radios, generally the IF amplifier stages were selected. In recent times, and especially with respect to television, more complete control was necessary and it became common to also gain control the "front end" or RF amplifier stage. This has been done with tube circuitry for some time and in general, has proven satisfactory.

In FM receivers a form of signal limiting to remove undesirable noises which may have been picked up during transmission is commonly employed. However, the degree of limiting becomes important under strong signal conditions since excessive conduction in transistors may lead to spurious noise response and general degradation of performance. Therefore, some type of conventional AGC control is generally utilized in the IF amplifier stages. There are, of course, limits to which any AGC system is subject and one of the major problems encountered is that of maintaining the signal handling capability of the circuit under strong signal conditions. In this connection, it is often desirable to AGC the RF stage as well.

The invention is concerned with circuitry for optimizing control of an FM receiver without sacrificing transistor signal handling capabilities. In accordance with the teachings of the invention, a conventional automatic gain control potential is developed for controlling an IF amplifier stage which is also utilized as a DC amplifier. The change in DC level in the IF amplifier is communicated to the RF amplifier in a manner such that the RF amplifier is driven more conductive responsive to an increase in strength or level of a received signal. The gain control (reduction) of the RF stage occurs since, under normal conditions, this stage is biased at substantially the maximum or peak point on its gain vs. bias characteristic curve. Thus, as the received signal increases in level, the bias current of the RF amplifier also increases, driving this transistor toward collector current saturation with a corresponding decrease in gain. An important point is that the signal handling capability of the RF stage is preserved while the signal output is reduced, thus protecting subsequent stages from overload.

This feature has been termed "forward AGC" to distinguish it from conventional AGC systems which reduce gain by biasing toward cutoff. Forward AGC biases toward saturation.

Accordingly, the primary object of this invention is to provide improved radio receiving apparatus.

A further object of this invention is to provide radio receiving apparatus having both a conventional AGC system and a "forward" AGC system.

A still further object of this invention is to provide an FM receiver wherein an IF amplifier also functions as a DC amplifier, and wherein the IF amplifier is gain controlled by conventional means and in turn gain controls an RF amplifier.

Another object of this invention is to provide radio receiving apparatus including a transistor amplifier biased at the peak point of its gain vs. bias characteristic and which is gain controlled by driving it into heavier conduction.

A feature of this invention resides in the provision of a voltage divider network for the RF amplifier stage subjected to forward AGC which allows the stage to be driven to full saturation current.

Further objects and advantages of the invention will be apparent upon reading the specification in conjunction with the drawing which is a partial schematic diagram of a transistorized FM receiver.

Turning now to the embodiments of the invention chosen for purposes of description, an antenna 10 is seen to couple received FM transmissions to a tunable circuit 11. A selected one of the numerous available FM transmissions is fed through a coupling capacitor 12 to the base electrode 23 of an RF transistor 20. Transistor 20 also includes an emitter electrode 21 and a collector electrode 22 and is of the NPN type, as are all transistors in the circuit. Transistors of the NPN type may in general be characterized by the statement that they are conductively biased when their base electrodes are positive with respect to their emitter electrodes. For germanium transistors, the base-emitter junction drop is on the order of 0.2 volt whereas for silicon transistors it is about 0.6 volt.

Transistor 20 has a load comprising a tuned circuit including an inductance element 25 and a variable capacitance element 26. Connected across a source of reference potential, which is disclosed only by its two terminal points B— and ground, is a voltage divider network consisting of three serially connected resistors 24, 27 and 28. Emitter 21 is connected between the junction of resistors 24 and 28 and the junction of resistors 27 and 28 is connected to the positive side of inductance 25.

It should be understood that the above circuit does not include any of the well known mechanical arrangements for selectively tuning the RF stage to any of the numerous FM transmissions available. These considerations are believed to be well within the skill of those working in the art and are not included here since they would add little to the disclosure.

The output of transistor 20 is coupled via a capacitor 29 to a box 35 labeled OSCILLATOR MIXER. Those skilled in the art will readily recognize this arrangement as including, a local oscillator for generating an oscillatory signal having a selectable frequency differing by a fixed amount from the carrier frequency of the particular FM signal translated by transistor 20, and a mixer stage for heterodyning the FM carrier signal with the locally generated signal to produce a beat or intermediate frequency carrier signal. The beat or IF signal output is coupled through capacitor 34 to the base 33 of an IF amplifier transistor 30.

Transistor 30 has an emitter 31, connected to B— through an emitter resistor 38, and a collector 32 connected to ground through a series combination of a resistor 39, a transformer winding 40 and an RC network including a variable resistance 41 and a capacitor 42. Transistor 30 functions as a normal amplifier for intermediate frequency signals which in most FM receivers is 10.7 megacycles. Capacitor 37 is a bypass for signal currents. Resistor 41 and capacitor 42 develop a potential which is directly related to DC flowing in transistor 30. As transistor 30 tends toward cutoff, the potential across the RC network rises toward ground potential.

The output of transistor 30 is coupled via secondary winding 43 (which is tuned by a parallel tuning capacitor 44) to the base 53 of a second IF amplifier transistor 50. Resistor 45, connected to the winding 43, provides proper operating bias. Transistor 50 has an emitter 51 connected to B— through a resistor 54 and a load consisting of a transformer winding 5. A secondary winding 56 couples the output signal to a detector circuit, not shown, where, in a conventional manner the intermediate frequency carrier is detected to recover the audio information contained therein. Thereafter the detected signal is amplified and used to drive a loudspeaker.

Conventional AGC is developed by a circuit arrangement consisting of a pair of diodes 57 and 59, a capacitor 58 connected to the junction thereof and a network including a capacitor 60, a resistor 61, and a resistor 36. The fact that two diodes are used has no bearing on the operation of the circuit, this being done only to obtain a larger potential drop. Under normal conditions the diodes are conducting since they are conductively connected (in series with resistors 61 and 36) between B— and ground. The resistance values are selected to produce proper bias for transistor 30 under no signal conditions. Under these conditions the diodes experience a conductive potential drop of about 0.2 volt each. A portion of the AC signal in transistor 50 is communicated by capacitor 58 to the diode network where rectification occurs. Under strong signal conditions a reverse bias of about 0.5 volt may be developed across each diode. thus causing the potential at base 33 to approach that at emitter 31 and hence, driving transistor 30 toward cutoff. Thus, the gain of transistor 30 decreases as the incoming level increases.

As the gain of transistor 30 changes, the DC component of signal current flowing therein also changes. As previously mentioned, the RC network is utilized to sense the DC current level in the transistor. The DC derived across the RC network is filtered by capacitor 46 and coupled through resistor 47 to base 23 of RF transistor 20.

It will be recalled that RF transistor 20 is biased at substantially the maximum point of its gain vs. bias characteristic. Consequently, a change in bias in either direction causes a decrease in gain capabilities of the stage. In the circuit arrangement shown, increasing signal levels result in decreased conduction in transistor 30 and in the potential across the RC network approaching ground (becoming more positive). Consequently, base 23 of transistor 20 swings in a positive direction and results in an increase in forward bias on the base-emitter junction of transistor 20. Transistor 20 is driven more heavily conductive and in effect has its gain reduced since it is already operating at its maximum gain point.

In order to driver transistor 20 into current saturation, it is necessary that its emitter-collector current be at least ten milliamperes and its emitter-collector voltage somewhat less than one volt. Under normal operating conditions its emitter-collector current is approximately two milliamperes. Transistor 20 is also fed a bias voltage from an IF amplifier, which requires a collector voltage of more than a certain minimum for proper operation. (For the amplifier transistor used, the minimum is six volts.) The bias potential on transistor 20 is six volts and, allowing for the one-half volt base-emitter drop encountered in silicon transistors, the value of emitter resistor required to limit the emitter-collector current of transistor 20 to two milliamperes may be readily calculated. If it is now assumed that IF amplifier 30 is cut off (the situation under extremely strong signal conditions), base 23 of transistor 20 is at ground potential and the maximum emitter-collector current flow in transistor 20 is determined by the B— voltage divided by the emitter resistance. It will be found that this result is far below the ten milliamperes required for emitter-collector saturation.

To overcome this problem, namely that of obtaining the full range of currents in the RF stage from a limited voltage swing in the IF stage, a voltage divider network is utilized for providing a high current swing capability. Essentially, this is accomplished by bypassing a large portion of the high current under normal signal conditions. In the circuit, resistor 28 provides the bypass around the output of transistor 20 under normal signal conditions. As transistor 20 is driven harder (by the forward AGC from transistor 30) its emitter-collector impedance decreases and current is directed from resistor 28 through the emitter-collector junction. In this manner, the emitter resistor for transistor 20 may be kept relatively small, thus insuring the development of sufficient saturation current. With this arrangement, normal signal currents for transistor 20 are obtainable as well as full saturation current within the limits of driving voltage available from transistor 30.

What has been described is a novel FM receiving circuit which utilizes forward AGC in the RF transistor amplifier for driving this transistor into saturation under strong signal conditions. It is recognized that numerous modifications and departures from the described embodiments may be envisioned by those skilled in the art without departing from the true spirit and scope of the invention as set forth in the claims.

The embodiments of the invention in which an exclusive property or privilege is claimed are defined as follows:

1. Radio receiving apparatus comprising: an RF transistor amplifier; means coupling a received RF signal to said RF transistor amplifier; mixer means, including oscillator means, connected to said RF transistor amplifier for heterodyning the output thereof with the signal from said oscillator means to produce an IF signal; an IF transistor amplifier connected to said mixer means; first gain control means coupled to said IF transistor amplifier for deriving a control potential therefrom for varying the translation characteristics thereof as an inverse function of the carrier signal level; second gain control means responsive to the DC current in said IF amplifier for driving the input circuit of said RF transistor amplifier toward saturation as a direct function of said carrier level, said RF transistor amplifier being normally biased at substantially the maximum point on its gain vs. bias characteristic curve; and a voltage divider network including a first resistor functioning as the emitter resistance of said RF transistor amplifier and a second resistor coupled across the output of said RF transistor amplifier.

2. In combination in an FM receiver: and RF amplifier, a first IF amplifier and a second IF amplifier, said preceding amplifiers all being transistorized and being connected in sequential arrangement; bias means establishing said RF amplifier at the maximum point on its gain vs. bias characteristic curve; means coupled to said second IF amplifier deriving a first control potential as a direct function of the signal level therein, said means including a diode capacitively coupled between said second IF amplifier and a DC source; means coupling said first control potential to said first IF amplifier for reducing the gain thereof with increasing signal level; DC responsive means in the output of said first IF amplifier and connected to the input of said RF amplifier; said DC responsive means forming a part of said bias means and reducing the gain of said RF amplifier by driving it toward saturation in response to increasing signal levels; a voltage divider network having one element connected in shunt with the output of said RF amplifier and another element in common with both the input and output circuits thereof; means impressing a DC potential across said voltage divider network, said DC responsive means and said another element establishing the total bias for said RF amplifier.

References Cited

UNITED STATES PATENTS 3,172,040 3/1965 Schultz ------------ 325—404X

OTHER REFERENCES

Sinclair: "Forward or Reverse Transistor AGC." Oct. 25, 1963 issue, Electronic Design, pp. 64–69.

ROBERT L. GRIFFIN, Primary Examiner

A. J. MAYER, Assistant Examiner

U.S. Cl. X.R.

325—404; 330—29, 134; 179—1F